(12) United States Patent
Matsui et al.

(10) Patent No.: US 8,795,454 B2
(45) Date of Patent: *Aug. 5, 2014

(54) MANUFACTURING METHOD FOR MONOLITHIC CERAMIC ELECTRONIC COMPONENT

(75) Inventors: Togo Matsui, Nagaokakyo (JP); Minoru Dooka, Nagaokakyo (JP); Hiroyoshi Takashima, Nagaokakyo (JP); Kenichi Okajima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/418,467

(22) Filed: Mar. 13, 2012

(65) Prior Publication Data

US 2012/0234462 A1 Sep. 20, 2012

(30) Foreign Application Priority Data

Mar. 14, 2011 (JP) .................................. 2011-055001
Feb. 7, 2012 (JP) .................................. 2012-024233

(51) Int. Cl.
*C03B 29/00* (2006.01)
*B29C 37/00* (2006.01)
*B44C 1/17* (2006.01)
*B29C 65/00* (2006.01)

(52) U.S. Cl.
USPC ........ 156/89.12; 156/232; 156/234; 156/250; 156/289

(58) Field of Classification Search
USPC ................................... 156/89.12
See application file for complete search history.

(56) References Cited

U.S. PATENT DOCUMENTS

| | | | | |
|---|---|---|---|---|
| 4,771,520 A * | 9/1988 | Tanaka et al. | | 29/25.42 |
| 5,261,986 A * | 11/1993 | Kawabata et al. | | 156/235 |
| 6,488,803 B2 * | 12/2002 | Kiuchi et al. | | 156/230 |
| 6,663,740 B2 * | 12/2003 | Yamasaki | | 156/248 |
| 2001/0019765 A1 | 9/2001 | Kiuchi et al. | | |
| 2002/0162628 A1 | 11/2002 | Yamasaki | | |
| 2003/0000079 A1 * | 1/2003 | Harada et al. | | 29/830 |
| 2003/0000709 A1 | 1/2003 | Gano | | |
| 2010/0146778 A1 * | 6/2010 | Dooka et al. | | 29/832 |

FOREIGN PATENT DOCUMENTS

| | | |
|---|---|---|
| JP | 59-222917 A | 12/1984 |
| JP | 61-237413 A | 10/1986 |
| JP | 61-248413 A | 11/1986 |

(Continued)

OTHER PUBLICATIONS

Dooka et al., JP 2010-267915 A, Nov. 2010, machine translation.*

(Continued)

*Primary Examiner* — Philip Tucker
*Assistant Examiner* — Alex Efta
(74) *Attorney, Agent, or Firm* — Keating & Bennett, LLP

(57) ABSTRACT

In a manufacturing method for a monolithic ceramic electronic component, a plurality of green chips arrayed in row and column directions which are obtained after cutting a mother block are spaced apart from each other and then tumbled, thereby uniformly making the side surface of each of the green chips an open surface. Thereafter, an adhesive is applied to the side surface. Then, by placing a side surface ceramic green sheet on an affixation elastic body, and pressing the side surface of the green chips against the side surface ceramic green sheet, the side surface ceramic green sheet is punched and stuck to the side surface.

6 Claims, 15 Drawing Sheets

(56) References Cited

FOREIGN PATENT DOCUMENTS

| | | | |
|---|---|---|---|
| JP | 6-349669 | A | 12/1994 |
| JP | 06349669 | A * | 12/1994 |
| JP | 9-153433 | A | 6/1997 |
| JP | 2010267915 | A * | 11/2010 |

OTHER PUBLICATIONS

Yamada, JP 06-349669 A, Dec. 1994, machine translation.*
Matsui et al., "Manufacturing Method for Monolithic Ceramic Electronic Component", U.S. Appl. No. 13/418,464, filed Mar. 13, 2012.

* cited by examiner

MANUFACTURING METHOD FOR MONOLITHIC CERAMIC ELECTRONIC COMPONENT

BACKGROUND OF THE INVENTION

1. Field of the Invention

The present invention relates to a manufacturing method for a monolithic ceramic electronic component, and more specifically, to a method for forming a protective area at the side of internal electrodes in a monolithic ceramic electronic component.

2. Description of the Related Art

A monolithic ceramic capacitor exists as an example of a monolithic ceramic electronic component to which the present invention is directed. To manufacture a monolithic ceramic capacitor, typically, a step as illustrated in FIGS. 21A and 21B is performed. That is, a first ceramic green sheet 3 on which a first internal electrode 1 is formed, and a second ceramic green sheet 4 on which a second internal electrode 2 is formed are alternately stacked in a plurality of layers. A raw component body is obtained by this stacking step. After the raw component body is fired, first and second external electrodes are formed on opposing first and second end surfaces of the sintered component body. Thus, the first and second internal electrodes 1 and 2 led out to the first and second end surfaces are electrically connected to the first and second external electrodes, respectively, and a monolithic ceramic capacitor is completed.

In recent years, monolithic ceramic capacitors are steadily decreasing in size, while monolithic ceramic capacitors that can provide high capacitance are being desired. To meet these demands, it is effective to increase the effective area occupied by each of the internal electrodes 1 and 2 on the stacked ceramic green sheets 3 and 4, that is, the opposing area of the internal electrodes 1 and 2. To increase such an effective area, it is important to reduce the dimensions of a protective area 5 at the side and the dimensions of a protective area 6 at the end illustrated in FIGS. 21A and 21B.

However, reducing the dimensions of the protective area 6 at the end undesirably increases the risk of short-circuiting of the first external electrode and the second external electrode via either one of the internal electrodes 1 and 2. Accordingly, it is appreciated that considering the reliability of the monolithic ceramic capacitor, it is more preferable to reduce the dimensions of the protective area 5 at the side than to reduce the dimensions of the protective area 6 at the end.

An example of an effective method for reducing the dimensions of the protective area 5 at the side is described in Japanese Unexamined Patent Application Publication No. 6-349669. According to the method described in Japanese Unexamined Patent Application Publication No. 6-349669, a plurality of ceramic green sheets on which an internal electrode pattern is printed are stacked in layers and compression bonded together to prepare a mother block, and after the mother block is cut into parts of a predetermined size to extract a plurality of green chips with internal electrodes exposed on their side surface along which the mother block is cut, these green chips are held by a holder, and in this state, a side surface ceramic green sheet is affixed to the side surface of each of the green chips to thereby form the protective area at the side.

However, the technique described in Japanese Unexamined Patent Application Publication No. 6-349669 mentioned above has the following problems.

Japanese Unexamined Patent Application Publication No. 6-349669 does not describe a specific method as to how the plurality of green chips obtained by cutting the mother block are held by the holder.

In green chips obtained by cutting the mother block, a plurality of internal electrodes with the same polarity are exposed on their end surface, while all the internal electrodes, that is, a plurality of internal electrodes with different polarities are exposed on their side surface. Therefore, in handling the green chips, an unwanted short-circuit may occur between the internal electrodes with different polarities unless utmost attention is paid to the handling of their side surfaces. In particular, as stacking ceramic green sheets become thinner, the distance between the internal electrodes with different polarities becomes smaller, increasing the risk of a short-circuit. If a short circuit occurs, a short failure occurs in the case of a monolithic ceramic capacitor, for example.

Accordingly, it is important to minimize contact with the side surface of green chips. However, in Japanese Unexamined Patent Application Publication No. 6-349669, there is no suggestion of the above-mentioned problems and, therefore, there is no proposal as to a favorable method of handling the green chips obtained by cutting the mother block.

Similar problems can be encountered not only when manufacturing monolithic ceramic capacitors but also when manufacturing monolithic ceramic electronic components other than monolithic ceramic capacitors.

SUMMARY OF THE INVENTION

Accordingly, preferred embodiments of the present invention provide a manufacturing method for a monolithic ceramic electronic component that can address the above-mentioned problems.

According to a preferred embodiment of the present invention, a manufacturing method for a monolithic ceramic electronic component includes the steps of preparing a mother block including a plurality of ceramic green sheets that are stacked on each other, and an internal electrode pattern arranged along each of a plurality of interfaces between the ceramic green sheets, cutting the mother block along a first cutting line and a second cutting line extending in mutually perpendicular or substantially perpendicular directions to obtain a plurality of green chips, the green chips each having a laminated structure including a plurality of ceramic layers and a plurality of internal electrodes that are in a raw state, the internal electrodes being exposed on a cut side surface that is produced by cutting along the first cutting line, affixing a side surface ceramic green sheet to the cut side surface to form a raw ceramic protective layer and obtain a raw component body that is a component body in a raw state, and firing the raw component body.

The green chips obtained by the cutting step are arrayed in row and column directions.

The above-mentioned manufacturing method further includes the step of, prior to the affixing step, tumbling the green chips in a state in which the green chips arrayed in the row and column directions are spaced apart from each other, to make the cut side surface of each of the green chips uniformly an open surface, and the affixing step includes the step of affixing the side surface ceramic green sheet to the cut side surface of each of the green chips that has become the open surface.

According to a preferred embodiment of the present invention, the manufacturing method further includes the step of affixing the green chips arrayed in the row and column directions onto an adhesive sheet having expandability, and expanding the adhesive sheet on which the green chips have been affixed, so that the green chips arrayed in the row and column directions become spaced apart from each other in the tumbling step.

According to a preferred embodiment of the present invention, a manufacturing method for a monolithic ceramic electronic component includes the steps of preparing a mother block, the mother block including a plurality of ceramic green sheets that are stacked, and an internal electrode pattern arranged along each of a plurality of interfaces between the ceramic green sheets, performing first cutting, the first cutting including cutting the mother block along a first cutting line to obtain a plurality of rod-shaped green block bodies, the rod-shaped green block bodies each having a laminated structure including a plurality of ceramic layers and a plurality of internal electrodes that are in a raw state, the internal electrodes being exposed on a cut side surface that is produced by cutting along the first cutting line, affixing a side surface ceramic green sheet to the cut side surface to form a raw ceramic protective layer, performing second cutting, the second cutting including cutting each of the rod-shaped green block bodies on which the raw ceramic protective layer has been formed, along a second cutting line extending in a direction perpendicular or substantially perpendicular to the first cutting line to obtain a plurality of raw component bodies that are each a component body in a raw state, and firing each of the raw component bodies. The rod-shaped green block bodies obtained by the first cutting step are arrayed in a predetermined direction, the manufacturing method further includes the step of, prior to the affixing step, tumbling the rod-shaped green block bodies in a state in which the rod-shaped green block bodies arrayed in the predetermined direction are spaced apart from each other, to make the cut side surface of each of the rod-shaped green block bodies uniformly an open surface, and the affixing step includes the step of affixing the side surface ceramic green sheet to the cut side surface of each of the rod-shaped green block bodies that has become the open surface.

According to a preferred embodiment of the present invention, the manufacturing method further includes the step of affixing the rod-shaped green block bodies arrayed in the predetermined direction onto an adhesive sheet having expandability, and expanding the adhesive sheet on which the rod-shaped green block bodies have been affixed, so that the rod-shaped green block bodies arrayed in the predetermined direction become spaced apart from each other in the tumbling step.

According to a preferred embodiment of the present invention, the manufacturing method further includes the step of applying an adhesive between the side surface ceramic green sheet and the cut side surface of each of the green chips or the rod-shaped green block bodies.

According to a preferred embodiment of the present invention, the affixing step includes the steps of placing the side surface ceramic green sheet on an affixation elastic body, pressing the cut side surface of each of the green chips or the rod-shaped green block bodies against the side surface ceramic green sheet with a force that substantially elastically deforms the affixation elastic body, and separating each of the green chips or the rod-shaped green block bodies from the affixation elastic body in a state in which the side surface ceramic green sheet is stuck to the cut side surface.

According to a preferred embodiment of the present invention, the side surface ceramic green sheet has dimensions larger than the cut side surface of each of the green chips or the rod-shaped green block bodies, and the pressing of the cut side surface of each of the green chips or the rod-shaped green block bodies against the side surface ceramic green sheet includes punching the side surface ceramic green sheet by an edge of the cut side surface of each of the green chips or the rod-shaped green block bodies.

According to a preferred embodiment of the present invention, in a case where the side surface ceramic green sheet has dimensions larger than the cut side surface of each of the green chips or the rod-shaped green block bodies, the manufacturing method further includes the step of, after the above-mentioned affixing step, removing an unnecessary portion of the side surface ceramic green sheet other than a portion that is affixed to the cut side surface of each of the green chips or the rod-shaped green block bodies.

According to a preferred embodiment of the present invention, the manufacturing method further includes the step of thermo-compression bonding each of the green chips or the rod-shaped green block bodies and the raw ceramic protective layer together at a temperature of not higher than about 200° C. to improve their adhesion, after forming the raw ceramic protective layer by affixing the side surface ceramic green sheet to the cut side surface of each of the green chips or the rod-shaped green block bodies.

According to a preferred embodiment of the present invention, the manufacturing method may further include the step of forming an external electrode on a predetermined surface of the component body so as to be electrically connected to a specific one of the internal electrodes.

According to a preferred embodiment of the present invention, a manufacturing method for a monolithic ceramic electronic component includes the steps of preparing a mother block, the mother block including a plurality of ceramic green sheets that are stacked, and an internal electrode pattern arranged along each of a plurality of interfaces between the ceramic green sheets, and cutting the mother block along a first cutting line and a second cutting line extending in mutually perpendicular or substantially perpendicular directions to obtain a plurality of green chips, the green chips each having a laminated structure including a plurality of ceramic layers and a plurality of internal electrodes that are in a raw state, the internal electrodes being exposed on a cut side surface that is produced by cutting along the first cutting line. The green chips obtained by the cutting step are arrayed in row and column directions, and the manufacturing method further includes the step of, after the cutting step, tumbling the green chips in a state in which the green chips arrayed in the row and column directions are spaced apart from each other, to make the cut side surface of each of the green chips uniformly an open surface.

According to a preferred embodiment of the present invention mentioned above, in handling the green chips arrayed in the row and column directions or the rod-shaped green block bodies arrayed in the predetermined direction which are obtained by cutting the mother block, the tumbling step is performed which includes tumbling the green chips or the rod-shaped green block bodies in a state in which the arrayed green chips or rod-shaped green block bodies are spaced apart from each other, thereby making the cut side surface of each of the green chips or the rod-shaped green block bodies uniformly an open surface. Thus, it is possible to reduce the possibility of unwanted external force being exerted on the cut side surface of the green chip or the rod-shaped green block body. Therefore, it is possible to reduce the chances of short-circuiting, even when the stacking ceramic green sheets become thinner and therefore the distance between internal electrodes of different polarities decreases.

According to the preferred embodiments of the present invention mentioned above, the affixing step, which includes affixing the side surface ceramic green sheet to the cut side surface of the green chip that has become an open surface to thereby form a raw ceramic protective layer, is performed simultaneously for each of a plurality of green chips arrayed in the row and column directions and whose cut side surface is uniformly oriented so as to become an open surface. Thus, as in the case of performing the affixing step for the rod-shaped green block body, the affixing step can be implemented efficiently, and variations in the applied thickness of the raw ceramic protective layer among the green chips can be suppressed and prevented.

According to the preferred embodiments of the present invention mentioned above, by applying an adhesive between the side surface ceramic green sheet and the cut side surface of the green chip or the rod-shaped green block body, the adhesion between the side surface ceramic green sheet and the cut side surface of the green chip or the rod-shaped green block body can be enhanced. Therefore, even if a heating step is performed to improve adhesion, the heating temperature does not need to be set very high. Therefore, it is possible to suppress and prevent unwanted deformation of the side surface ceramic green sheet and the green chip or the rod-shaped green block body due to heating.

According to the preferred embodiments of the present invention described above, after forming the raw ceramic protective layer by affixing the side surface ceramic green sheet to the cut side surface of the green chip or the rod-shaped green block body, if the raw ceramic protective and the green chip or the rod-shaped green block body are thermocompression bonded together at a temperature of about 200° C., for example, the adhesion between the green chip or the rod-shaped green block body and the raw ceramic protective layer can be enhanced while suppressing and preventing unwanted deformation of the side surface ceramic green sheet and the green chip or the rod-shaped green block body due to heating.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention are described, with a monolithic ceramic capacitor taken as a non-limiting example of monolithic ceramic electronic component.

FIGS. 1 to 16 illustrate a first preferred embodiment of the present invention.

Figure 1:
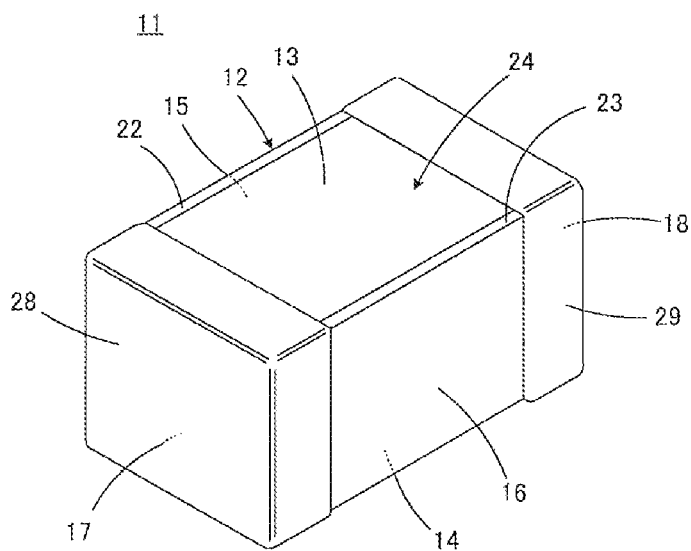
FIG. 1 is a perspective view of the outward appearance of a monolithic ceramic capacitor as an example of a monolithic ceramic electronic component obtained by a manufacturing method according to a first preferred embodiment of the present invention.
Figure 2:
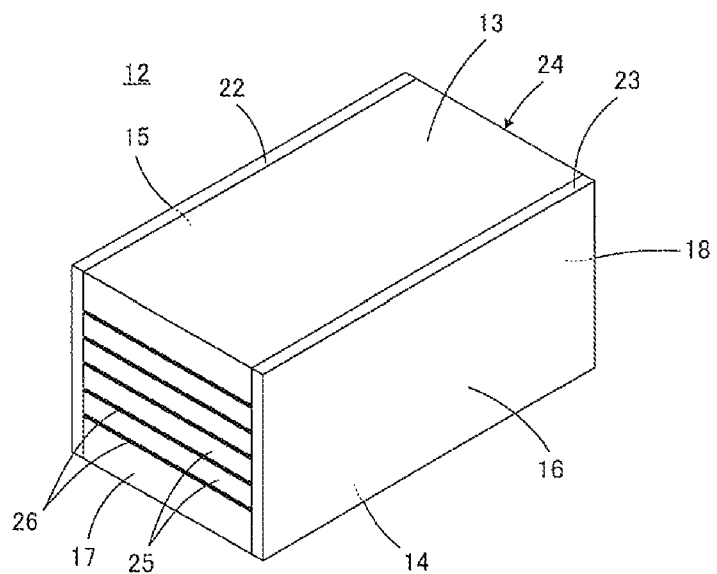
FIG. 2 is a perspective view of the outward appearance of a component body included in the monolithic ceramic capacitor illustrated in FIG. 1.

First, as illustrated in FIG. 1, a monolithic ceramic capacitor 11 includes a component body 12. The component body 12 is illustrated singly in FIG. 2. The component body 12 preferably has a rectangular parallelepiped or substantially rectangular parallelepiped shape including a pair of opposing principal surfaces 13 and 14, a pair of opposing side surfaces 15 and 16, and a pair of opposing first and second end surfaces 17 and 18.

Figure 3:
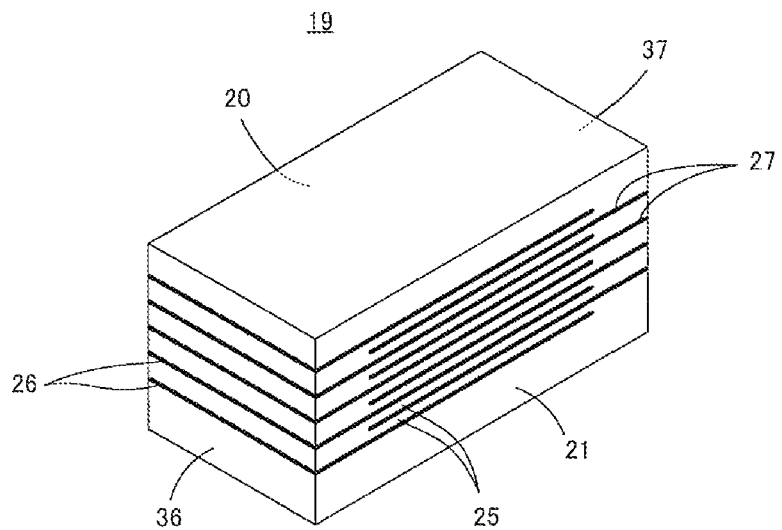
FIG. 3 is a perspective view of the outward appearance of a green chip prepared to obtain the component body illustrated in FIG. 2.

In describing the component body 12 in detail, reference is also made to FIG. 3 illustrating the outward appearance of a green chip 19 prepared to obtain the component body 12. As will be appreciated from a description given later, the component body 12 corresponds to a component body obtained by forming a pair of first and second ceramic protective layers 22 and 23 in their raw state on a pair of opposing first and second side surfaces (hereinafter, referred to as "cut side surfaces") 20 and 21 of the green chip 19 illustrated in FIG. 3 and then firing the resulting green chip 19. In the following description, the portion of the fired component body 12 which is derived from the green chip 19 is referred to as a laminate section 24.

The laminate section 24 in the component body 12 has a laminated structure including a plurality of ceramic layers 25 extending along the direction of the principal surfaces 13 and 14 and stacked in a direction perpendicular or substantially perpendicular to the principal surfaces 13 and 14, and a plurality of pairs of first and second internal electrodes 26 and 27 each arranged along the interface between the ceramic layers 25. Also, the component body 12 includes the pair of ceramic protective layers 22 and 23 that are placed on the cut side surfaces 20 and 21 of the laminate section 24 so as to provide the component body 12 with its side surfaces 15 and 16, respectively. The ceramic protective layers 22 and 23 preferably have the same thickness.

While in FIG. 1 and the like the boundary between the laminate section 24 and each of the ceramic protective layers 22 and 23 is depicted clearly, the boundary is depicted clearly for the convenience of description. In actuality, such a boundary does not appear clearly.

The first and second internal electrodes 26 and 27 oppose each other via each of the ceramic layers 25. This opposing arrangement causes electrical characteristics to manifest themselves. That is, a capacitance is generated in the case of the monolithic ceramic capacitor 11.

The first internal electrodes 26 include an exposed end that is exposed on the first end surface 17 of the component body 12, and the second internal electrodes 27 include an exposed end that is exposed on the second end surface 18 of the component body 12. However, the internal electrodes 26 and 27 are not exposed on the side surfaces 15 and 16 of the component body 12 because the ceramic protective layers 22 and 23 described above are placed on these end surfaces.

The monolithic ceramic capacitor 11 further includes external electrodes 28 and 29. The external electrodes 28 and 29 are arranged on at least the pair of end surfaces 17 and 18 of the component body 12 so as to be electrically connected to the exposed ends of the internal electrodes 26 and 27, respectively.

As the conductive material for the internal electrodes 26 and 27, for example, Ni, Cu, Ag, Pd, Ag—Pd alloy, Au, other suitable material may preferably be used.

As the ceramic material forming the ceramic layers 25 and the ceramic protective layers 22 and 23, for example, a dielectric ceramic containing $BaTiO_3$, $CaTiO_3$, $SrTiO_3$, $CaZrO_3$, or other suitable material as its principal component may preferably be used.

Preferably, at least the principal component of the ceramic material forming the ceramic protective layers 22 and 23 is the same as that of the ceramic material used to form the ceramic layers 25. In this case, most preferably, a ceramic material of the same composition is used for both the ceramic layers 25 and the ceramic protective layers 22 and 23.

The present invention is also applicable to a monolithic ceramic electronic component other than a monolithic ceramic capacitor. In a case where the monolithic ceramic electronic component is a piezoelectric component, a piezoelectric ceramic such as a PZT ceramic may preferably be used, and in a case where the monolithic ceramic electronic component is a thermistor, a semiconductor ceramic such as a spinel ceramic may preferably be used, for example.

As described above, the external electrodes 28 and 29 are provided on at least the pair of end surfaces 17 and 18 of the component body 12. In this preferred embodiment, the external electrodes 28 and 29 include a portion that goes around and extends over a portion of each of the principal surfaces 13 and 14 and the side surfaces 15 and 16.

Although not illustrated, the external electrodes 28 and 29 preferably include a primary coating and a plating layer provided on the primary coating. As the conductive material for the primary coating, for example, Cu, Ni, Ag, Pd, Ag—Pd alloy, Au, or other suitable material may preferably be used. The primary coating may be formed either by using a co-firing method that applies a conductive paste onto the component body 12 that has not been fired yet and firing the conductive paste simultaneously with the component body 12, or by using a post-firing method that applies and fires a conductive paste onto the component body 12 that has already been fired. Alternatively, the primary coating may be formed directly by plating, or may be formed by curing conductive resin including thermosetting resin.

The plating layer formed on the primary coating is preferably of a two-layer structure including Ni-plating and Sn-plating on top of the Ni-plating.

Next, referring further to FIGS. 4 to 16, a manufacturing method for the monolithic ceramic capacitor 11 described above is described.

Figure 4:
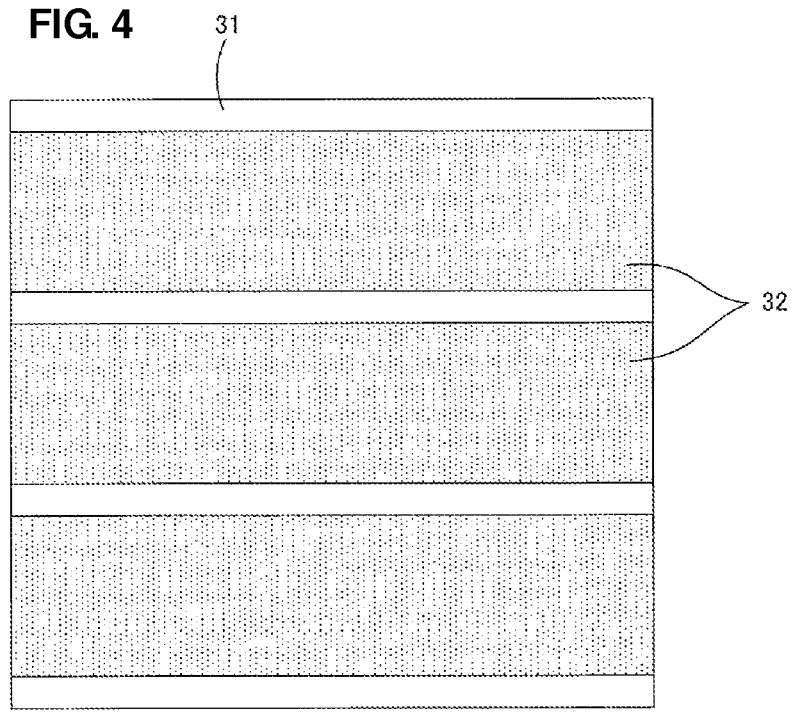
FIG. 4 is a plan view of each of stacking ceramic green sheets which are prepared to obtain the green chip illustrated in FIG. 3 and on which an internal electrode pattern is formed.

First, as partially illustrated in FIG. 4, each of stacking ceramic green sheets 31 that are to become the ceramic layers 25 are prepared. More specifically, a ceramic slurry containing ceramic powder, a binder, and a solvent is prepared, and as this ceramic slurry is shaped into a sheet form on a carrier film (not illustrated) by using a die coater, a gravure coater, a micro gravure coater, or other suitable device, the stacking ceramic green sheets 31 are obtained. The thickness of the stacking ceramic green sheets 31 is preferably not more than about 3 µm, for example.

Next, as similarly illustrated in FIG. 4, a conductive paste is printed with a predetermined pattern on the stacking ceramic green sheets 31. As a result, the stacking ceramic green sheets 31 each provided with an internal electrode pattern 32 that is to become each of the internal electrodes 26 and 27 are obtained. More specifically, a plurality of rows of strip-shaped internal electrode patterns 32 are formed on the stacking ceramic green sheets 31. The thickness of the internal electrode pattern 32 is preferably not more than about 1.5 µm, for example.

Figure 5A:
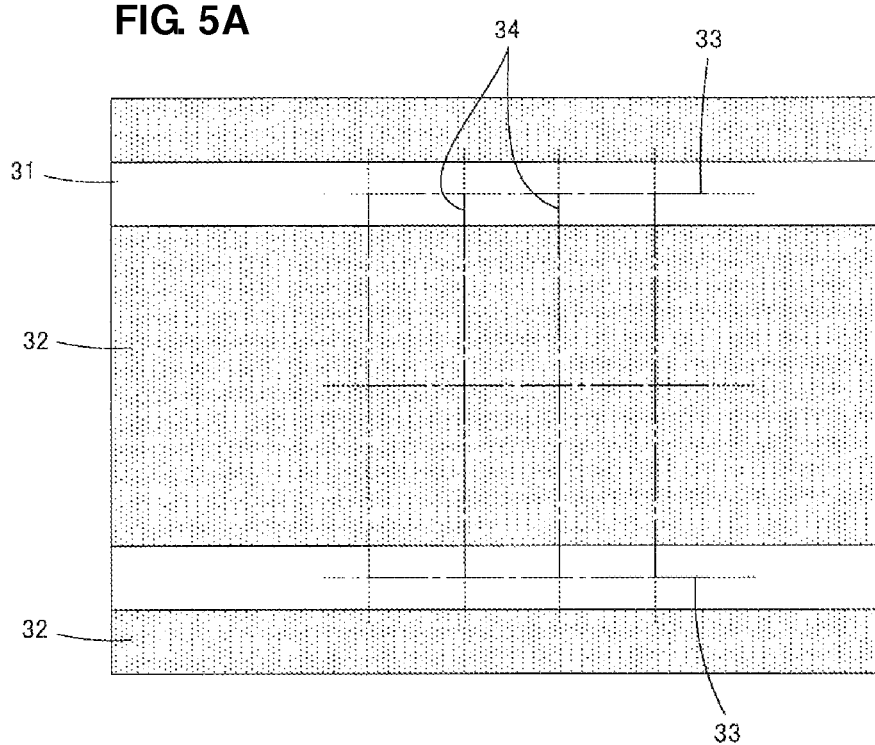
FIGS. 5A and 5B are plan views, enlarged from FIG. 4, illustrating a step of stacking the stacking ceramic green sheets illustrated in FIG. 4 while shifting the ceramic green sheets from each other by a predetermined distance.
Figure 5B:
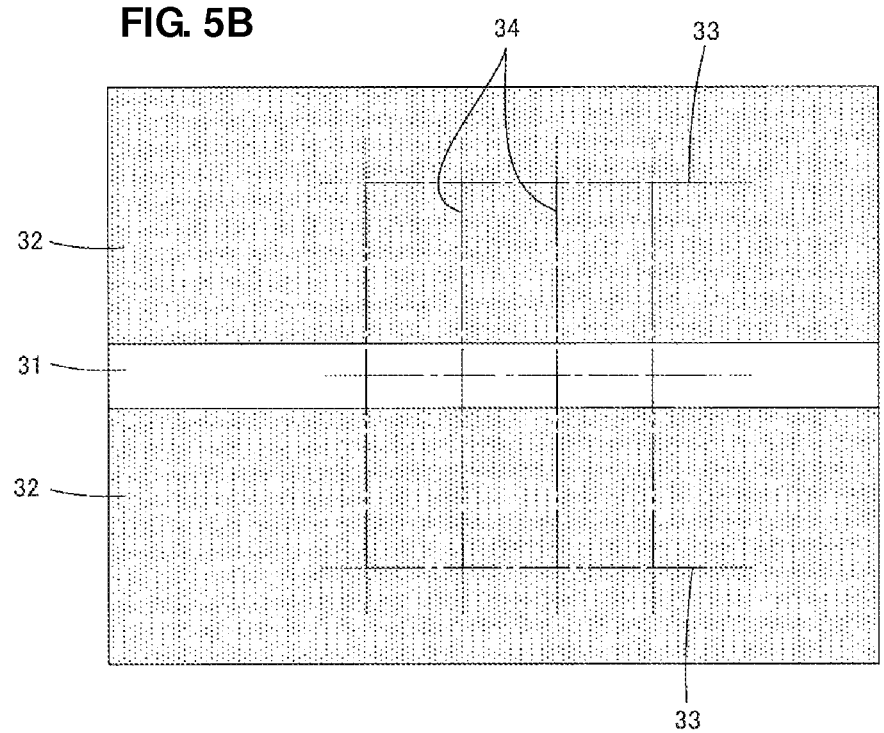

In FIGS. 5A and 5B, first cutting lines 33 along a first direction that is the longitudinal direction (the horizontal direction in FIGS. 5A and 5B) in which the strip-shaped internal electrode pattern 32 extends, and second cutting lines 34 along a second direction that is the width direction (the vertical direction in FIGS. 5A and 5B) perpendicular or substantially perpendicular to the cutting lines 33 are partially illustrated. The strip-shaped internal electrode pattern 32 has such a shape that two internal electrodes 26 and 27 coupled to each other through their lead sections are arranged contiguously along the longitudinal direction. FIGS. 5A and 5B are enlarged from FIG. 4.

Next, as illustrated in FIGS. 5A and 5B, a predetermined number of the stacking ceramic green sheets 31 with the internal electrode pattern 32 formed as described above are stacked with a shift of a predetermined distance, that is, half the widthwise dimension of the internal electrode pattern 32, along the width direction, and a predetermined number of stacking ceramic green sheets on which no conductive paste is printed and which serve as the outer layers are stacked on top and bottom of the resulting stack. Because the cutting lines 33 and 34 are illustrated in both FIGS. 5A and 5B, how to shift the stacking ceramic green sheets 31 when stacking can be easily understood by comparison between FIGS. 5A and 5B.

Figure 6A:
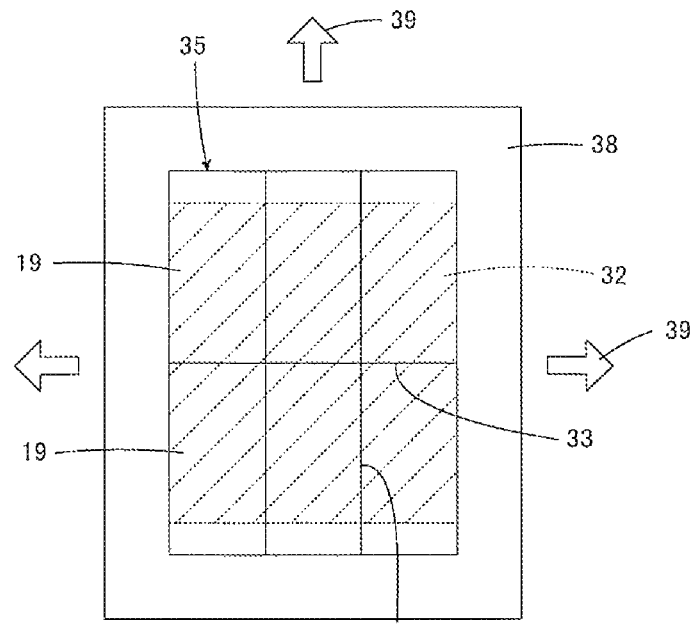
FIGS. 6A and 6B are respectively a plan view of a plurality of green chips obtained by cutting a mother block that is obtained by the stacking step illustrated in FIGS. 5A and 5B, and a plan view illustrating a state in which the green chips arrayed in the row and column directions in FIG. 6A have become spaced apart from each other.
Figure 6B:
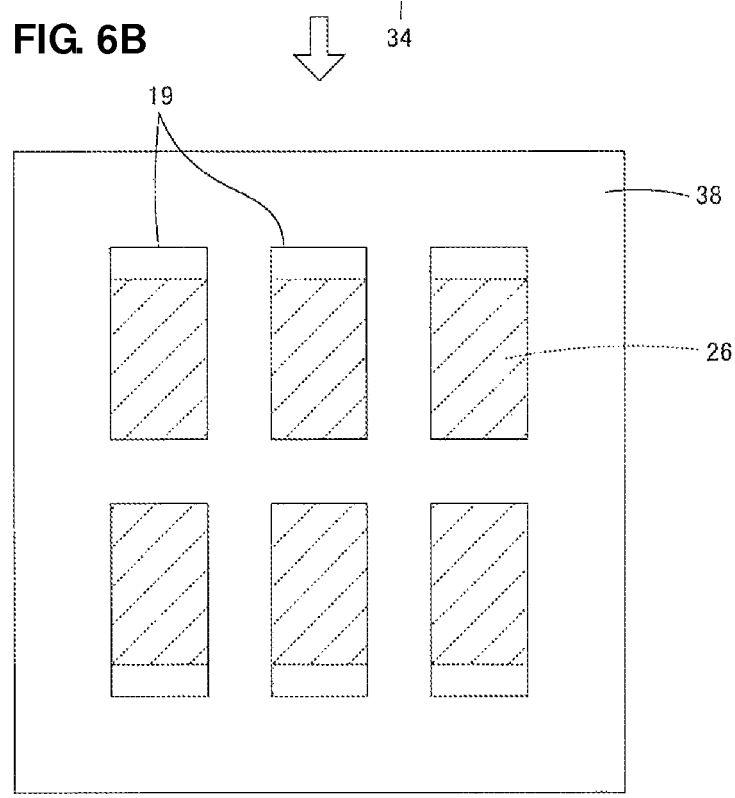

As a result of the stacking step described above, a mother block 35 illustrated in FIG. 6A is obtained. In FIGS. 6A and 6B, the uppermost internal electrode pattern 32 or internal electrode 26 located inside the mother block 35 is indicated by broken lines.

Next, the mother block 35 is pressed in the stacking direction by a method such as isostatic pressing.

Next, the mother block 35 is cut along the first cutting lines 34 and the second cutting lines 33 that are perpendicular or substantially perpendicular to each other. As a result, as illustrated in FIG. 6A, a plurality of green chips 19 being arrayed in the row and column directions are obtained. Dicing, force-cutting, laser cutting, or other suitable process may be preferably used for this cutting. In drawings such as FIG. 6A, for reasons related to the creation of the drawings, a single mother block 35 is depicted as being dimensioned such that six green chips 19 are extracted from the mother block 35. However, in actuality, the mother block 35 is dimensioned such that more green chips 19 are extracted.

As illustrated singly in FIG. 3, each of the green chips 19 has a laminated structure including the plurality of ceramic layers 25 and the plurality of internal electrodes 26 and 27 which are in their raw state. The cut side surfaces 20 and 21 of the green chips 19 are surfaces that are produced by cutting along the first cutting lines 34, and the end surfaces 36 and 37 are surfaces that are produced by cutting along the second cutting lines 33. All of the internal electrodes 26 and 27 are exposed on the cut side surfaces 20 and 21. Only the first internal electrodes 26 are exposed on the end surface 36, and only the second internal electrodes 27 are exposed on the other end surface 37.

As illustrated in FIG. 6A, the green chips 19 arrayed in the row and column directions are affixed onto an adhesive sheet 38 having expandability. Then, the adhesive sheet 38 is expanded as indicated by an arrow 39 by an expander (not illustrated). As a result, as illustrated in FIG. 6B, the green chips 19 arrayed in the row and column directions become spaced apart from each other.

At this time, the adhesive sheet 38 is expanded to an extent that allows the green chips 19 to be smoothly tumbled without hitting each other in the tumbling step that will be performed later. Although depending on the dimensions of the green chips 19, as an example, the adhesive sheet 38 is expanded to about 160% of the original dimensions.

As the adhesive sheet 38 mentioned above, for example, an adhesive sheet made of polyvinyl chloride resin whose adhesive layer is given by an acrylic adhesive is used. The adhesive sheet 38 has such a plasticity that the adhesive sheet 38 does not completely return to the original shape once expanded. Therefore, handling of the adhesive sheet 38 that has been expanded is easy. For example, after the green chips 19 are obtained by cutting the mother block 35, there is a possibility that the cut side surfaces 20 and 21 or end surfaces 36 and 37 of the adjacent green chips 19 adhere to each other again owing to the binder included in the green chips 19. However, since the adhesive sheet 38 does not completely return to the original shape once expanded, it is possible to avoid a situation where the cut side surfaces 20 and 21 or the end surfaces 36 and 37 come into contact with and therefore adhere to each other again.

Next, a tumbling step is performed. In the tumbling step, the green chips 19 are tumbled to thereby make the first cut side surface 20 of each of the green chips 19 uniformly an open surface.

Figure 7A:
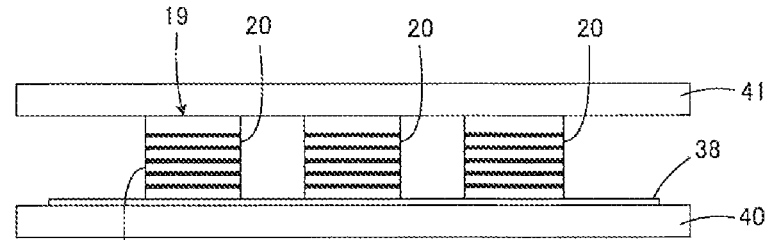
FIGS. 7A and 7B are views as seen from the direction of the end surface of the green chips, illustrating a tumbling step of tumbling the green chips illustrated in FIG. 6B.

Accordingly, as illustrated in FIG. 7A, the green chips 19 are placed on a support base 40 together with the adhesive sheet 38. On the other hand, a tumbling action plate 41 is placed so as to be able to act on the green chips 19 from above. The support base 40 and the tumbling action plate 41 are preferably made of silicone rubber.

Figure 7B:
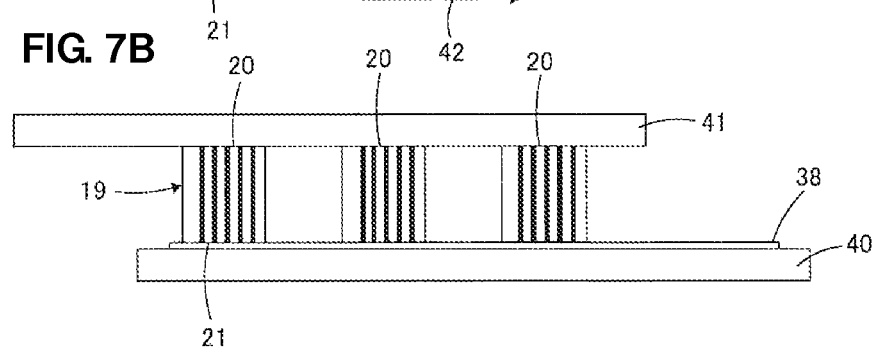

Next, the support base 40 is moved in the direction of an arrow 42 with respect to the tumbling action plate 41. As a result, as illustrated in FIG. 7B, the green chips 19 are rotated by 90 degrees all at once, resulting in a state in which their first cut side surface 20 faces upwards. When the tumbling action plate 41 is removed in this state, the first cut side surface 20 becomes an open surface.

To perform the above-mentioned tumbling of the green chips 19 more smoothly, the tumbling operation may be performed after transferring the green chips 19 from the adhesive sheet 38 onto an adhesive rubber sheet. In this case, it is preferable that the adhesive rubber sheet have an elastic coefficient of not more than about 50 MPa and a thickness of not more than about 5 mm, for example.

Figure 8:
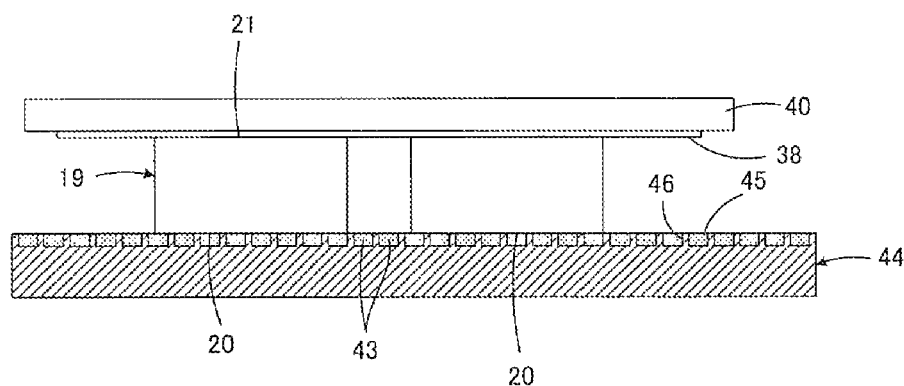
FIG. 8 is a view as seen from the direction of the principal surface of the green chips, illustrating an applying step of applying a ceramic paste to form a raw first ceramic protective layer on a first cut side surface of the green chips that has become an open surface as a result of the tumbling step illustrated in FIGS. 7A and 7B.

Next, an adhesive applying step is performed as required as illustrated in FIG. 8. In the adhesive applying step, an adhesive 43 is applied to the first cut side surface 20 of the green chips 19 that has become an open surface. The adhesive 43 may be an adhesive made of a single component, or may be an adhesive obtained by dissolving resin in a solvent. Further, the adhesive 43 may be a paste in which ceramic particles are dispersed.

Figure 9:
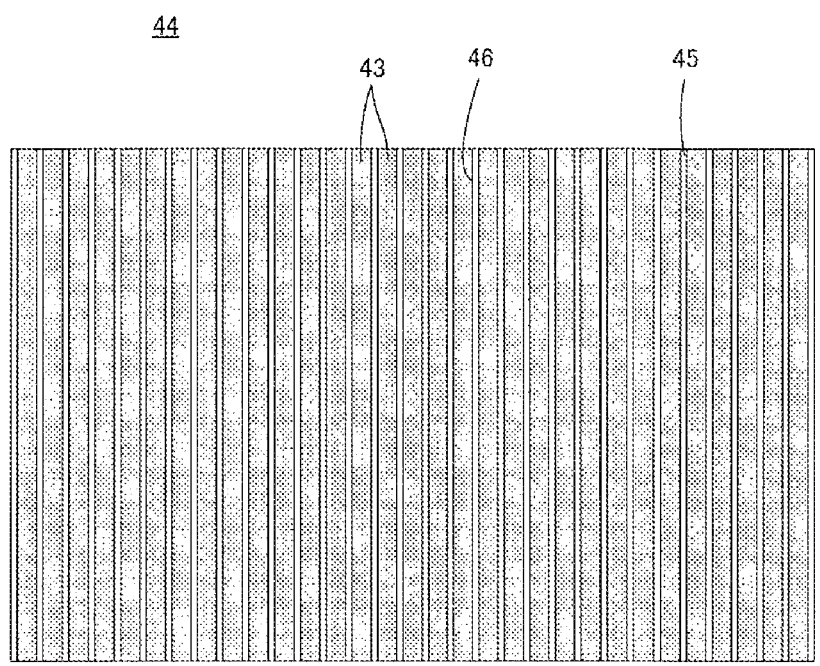
FIG. 9 is a plan view of an application plate illustrated in FIG. 8.

For application of the adhesive 43, an application plate 44 illustrated in FIGS. 8 and 9 is prepared. The application plate 44 includes an application surface 45 that abuts against the cut side surface 20 of the green chips 19. The application surface is provided with a recess 46 to hold the adhesive 43. The recess 46 is filled with the adhesive 43. In this preferred embodiment, as clearly illustrated in FIG. 9, the recess 46 is preferably defined by a plurality of grooves.

In performing the adhesive applying step, as illustrated in FIG. 8, the following steps are performed: abutting the application surface 45 of the application plate 44 against the cut side surface 20 of the green chips 19, and bringing the adhesive 43 filled in the recess 46 into contact with the cut side surface 20; and transferring the adhesive 43 filled in the recess 46 to the cut side surface 20 of the green chips 19 while separating the green chips 19 from the application plate 44. In this case, capillary action or the like also works so that the adhesive 43 is applied to the entire cut side surface 20 of the green chips 19. On the other hand, the adhesive 43 is not applied to surfaces of the green chips 19 other than the cut side surface 20. The thickness of the adhesive 43 applied can be adjusted by adjusting the width, depth, or arrangement pitch of the recess 46, the viscosity of the adhesive 43, and so on.

Figure 10A:
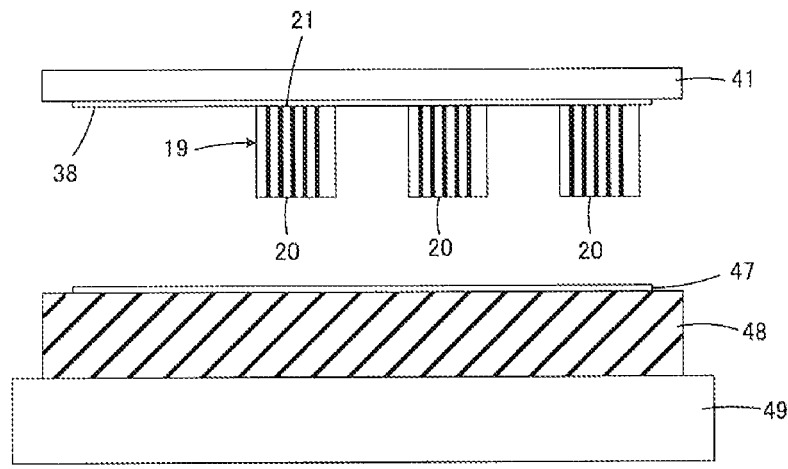
FIGS. 10A to 10C are views as seen from the direction of the end surface of the green chips, illustrating an affixing step of affixing a side surface ceramic green sheet to the first cut side surface of the green chips to thereby form a first ceramic protective layer in its raw state.
Figure 10B:
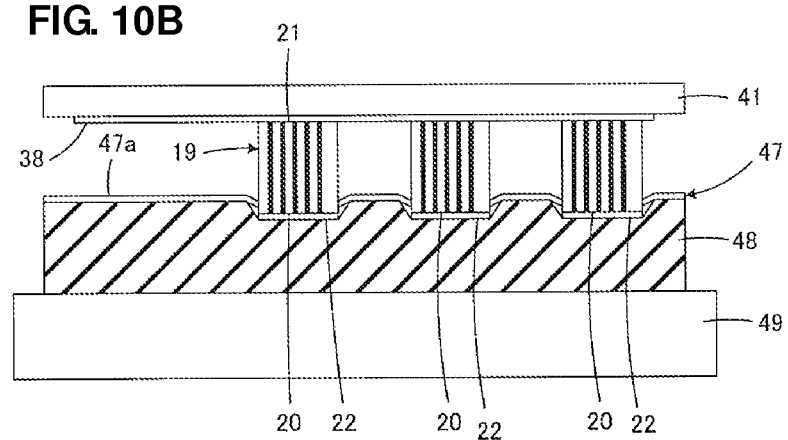
Figure 10C:
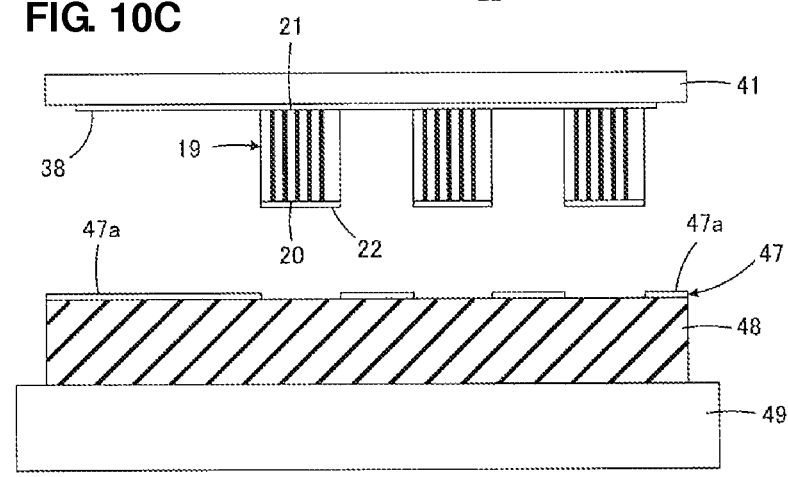

Next, an affixing step is performed as required as illustrated in FIGS. 10A to 10C. In the affixing step, a side surface ceramic green sheet 47 is applied to the first cut side surface 20 of the green chips 19 that has become an open surface to thereby form the first ceramic protective layer 22 in its raw state. As in the case of the stacking ceramic green sheets 31 previously described, the side surface ceramic green sheet 47 is also obtained by preparing a ceramic slurry containing ceramic powder, a binder, and a solvent, and shaping this ceramic slurry into a sheet form on a carrier film (not illustrated) by using a die coater, a gravure coater, a micro gravure coater, or other suitable device.

More specifically, first, as illustrated in FIG. 10A, the side surface ceramic green sheet 47 is placed so as to face the first cut side surface 20 of the green chips 19. The side surface ceramic green sheet 47 is placed on an affixation elastic body 48 used for the purpose of affixation, and the affixation elastic body 48 is placed on a stationary table 49. Preferably, the side surface ceramic green sheet 47 is not backed with a carrier film at this point. The side surface ceramic green sheet 47 has dimensions larger than the first cut side surface 20 of the green chips 19.

The aforementioned adhesive application may not be performed on the green chips 19 but may instead be performed on the side surface ceramic green sheet 47 by using, for example, a spraying method. Of course, the adhesive may be applied to both the green chips 19 and the side surface ceramic green sheet 47.

Next, the green chips 19 are brought into proximity with the side surface ceramic green sheet 47, and as illustrated in FIG. 10B, the first cut side surface 20 of the green chips 19 is pressed against the side surface ceramic green sheet 47 with such a force that substantially elastically deforms the affixation elastic body 48. At this time, preferably, by causing a shearing force to be exerted from the edge of the cut side surface 20 of each of the green chips 19, portions of the side surface ceramic green sheet 47 corresponding to the dimensions of the cut side surface 19 are punched out. Although heating is not particularly required in this punching process, in a case where heating is performed, to prevent the side surface ceramic green sheet 47 from crushing without being punched, the heating temperature is set to a temperature not higher than the transition point at which the side surface ceramic green sheet 47 softens.

The above-mentioned shearing force is produced as the green chips 19 are pressed into the affixation elastic body 48. At this time, the edge lines of the green chips 19 are in the same state as that after the cutting step illustrated in FIGS. 6A and 6B is finished, that is, not chamfered by barrel polishing or the like. Thus, the edge lines are pointed sharply, which makes it possible to concentrate the shearing force on the portions of the side surface ceramic green sheet 47 to be punched out. Therefore, punching of the side surface ceramic green sheet 47 can be performed smoothly.

As previously mentioned, punching of the side surface ceramic green sheet 47 is easier if the side surface ceramic green sheet 47 is not backed with a carrier film. In this case, the thickness of the side surface ceramic green sheet 47 is preferably about 10 µm to about 50 µm, for example. This is because if its thickness is less than about 10 µm, the side surface ceramic green sheet 47 becomes too weak owing to the absence of backing with a carrier film, which makes its handling difficult. On the other hand, a thickness exceeding about 50 µm makes punching of the side surface ceramic green sheet 47 difficult.

To ensure that the above-mentioned punching be performed more smoothly, it is preferable that the breaking strength of the side surface ceramic green sheet 47 be not lower than about 1 MPa and not higher than about 50 MPa, and its breaking strain be not more than about 50%, for example. Also, the amount of pressing of the green chips 19 into the affixation elastic body 48 is preferably not more than half the distance between the green chips 19 that are adjacent to each other with respect to the thickness direction (the horizontal direction in FIGS. 10A to 10C) of the green chips 19. Making this amount of pressing too large can damage the green chips 19.

Also, the affixation elastic body 48 preferably has an elastic coefficient of not more than about 50 MPa, and a thickness of not more than about 5 mm, for example. The lower the elastic coefficient of the side surface ceramic green sheet 47 with respect to the affixation elastic body 48, the more likely a shearing force acts on the edge portion of the cut side surface 20 of the green chips 19, thereby making it possible to suppress chipping or burring of the punched side surface ceramic green sheet 47 or cracking in the edge portion of the cut edge surface 20 of the green chips 19.

When punching the side surface ceramic green sheet 47 by the green chips 19, rather than pressing the green chips 19 only once, the green chips 19 may be repeatedly pressed a plurality of times within the elastic deformation range of the side surface ceramic green sheet 47. This method can suppress and prevent plastic deformation of the side surface ceramic green sheet 47, thereby reducing the compressing force exerted on the green chips 19 by an unnecessary portion 47a of the side surface ceramic green sheet 47 which remains after the punching. This reduction in compressing force facilitates removal of the unnecessary portion 47a of the side surface ceramic green sheet 47 in the step performed next, that is, the step of separating the green chips 19 from the affixation elastic body 48 illustrated in FIG. 10C.

In the step of affixing the side surface ceramic green sheet 47, the adhesion between the side surface ceramic green sheet 47 and the green chips 19 may be enhanced by performing heating to an extent that does not cause unwanted deformation resulting from increased plasticity of the side surface ceramic green sheet 47.

To facilitate handling of the side surface ceramic green sheet 47, or the unnecessary portion 47a of the side surface ceramic green sheet 47 other than the portion affixed to the green chips 19 which will become the ceramic protective layer 22, the side surface ceramic green sheet 47 may be handled in a state in which the side surface ceramic green sheet 47 is backed with a carrier film.

Next, as illustrated in FIG. 10C, in the state in which the portion of the side surface ceramic green sheet 47 that has become the ceramic protective layer 22 is adhered to the first cut side surface 20, the green chips 19 are separated from the affixation elastic body 48. At this time, the unnecessary portion 47a of the side surface ceramic green sheet 47 which remains after the punching is left on the affixation elastic body 48 side. To leave the unnecessary portion 47a on the affixation elastic body 48 side in this way, it is necessary to fix the unnecessary portion 47a to the affixation elastic body 48.

This fixing may be done by sticking the entire unnecessary portion 47a, fixing the unnecessary portion 47a only in the surrounding portion of the area where the green chips 19 are arrayed, or fixing the unnecessary portion 47a only in the surrounding portion of each individual one of the green chips 19.

Figure 11:
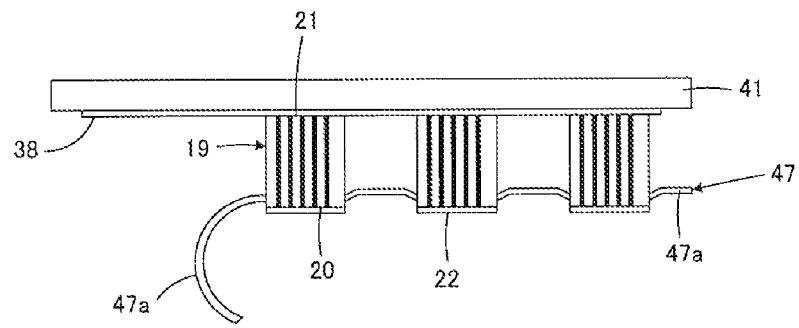
FIG. 11 is a view as seen from the direction of the end surface of the green chips, illustrating a state in which an unnecessary portion of the side surface ceramic green sheet illustrated in FIG. 10C is being removed by roll separation.

To facilitate removal of the unnecessary portion 47a of the side surface ceramic green sheet 47 illustrated in FIG. 10C, roll separation as illustrated in FIG. 11 may be used. That is, the necessary portion 47a is removed from the green chips 19 while having its end wound into a roll.

In this way, the green chips 19 supported by the support base 40 via the adhesive sheet 38 have the raw first ceramic protective layer 22 formed on their first cut side surface 20. Rather than having dimensions larger than the cut side surface 20 of the green chips 19, the side surface ceramic green sheet 47 may be cut into the substantially same dimensions as the cut side surface 20 in advance before performing the affixing step.

Figure 12:
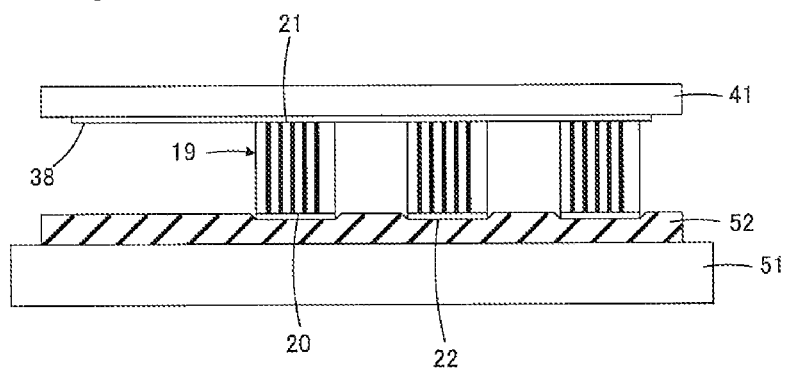
FIG. 12 is a view as seen from the direction of the end surface of the green chips, illustrating a compression bonding step in which the ceramic protective layer side of the green chips having the raw first ceramic protective layer formed on the first cut side surface is pressed into a compression-bonding elastic body.

Next, as illustrated in FIG. 12, a compression-bonding elastic body 52 used for the purpose of compression bonding which is held on a stationary table 51 is prepared. As described above, after the raw first ceramic protective layer 22 is formed on the first cut side surface 20, a compression bonding step is performed to improve the adhesion between the green chips 19 and the raw ceramic protective layer 22. In the compression bonding step, the ceramic protective layer 22 side of the green chips 19 is pressed into the compression-bonding elastic body 52. At this time, to prevent unwanted deformation, cracks, or the like from occurring in the green chips 19 and the side surface ceramic green sheet 47, heating is performed at a temperature of not higher than about 200° C., preferably at a temperature not higher than the transition point at which the side surface ceramic green sheet 47 softens. Preferably, the compression-bonding elastic body 52 has an elastic coefficient that makes the compression-bonding elastic body 52 harder than the side surface ceramic green sheet 47 and softer than the green chips 19, for example, an elastic coefficient of not higher than about 50 MPa, and has a thickness of not more than about 5 mm.

Next, a tumbling step similar to the step described above with reference to FIGS. 7A and 7B is performed. That is, the green chips 19 are tumbled to thereby uniformly make the second cut side surface 21 of each of the green chips 19 an open surface.

Figure 13A:
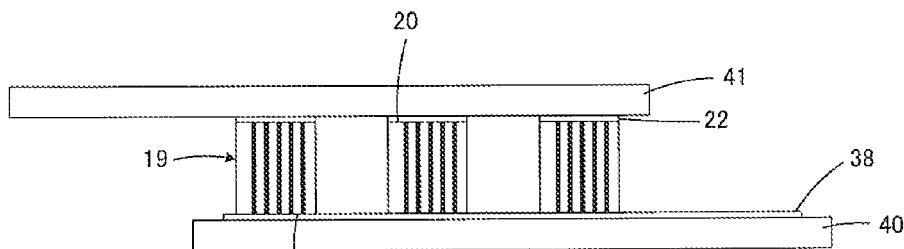
FIGS. 13A and 13B are views as seen from the direction of the end surface of the green chips, illustrating a tumbling step of tumbling the green chips again after the compression bonding step illustrated in FIG. 12.

Accordingly, as illustrated in FIG. 13A, the tumbling action plate 41 is placed so as to be able to act on the green chips 19 supported by the support base 40 via the adhesive sheet 38 from above.

Figure 13B:
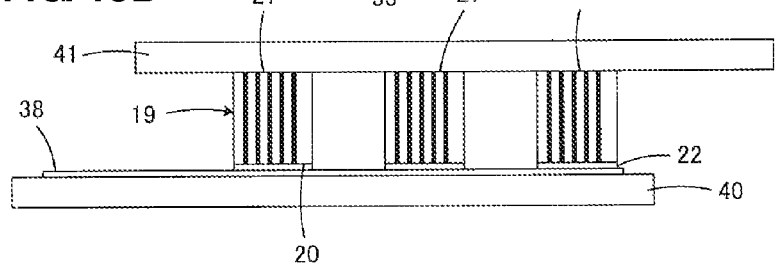

Next, the support base 40 is moved in the direction of an arrow 53 with respect to the tumbling action plate 41. As a result, rotating the green chips 19 all at once by 90 degrees is repeated twice, resulting in a state as illustrated in FIG. 13B in which the second cut side surface 21 of each of the green chips 19 faces upwards. When the tumbling action plate 41 is removed in this state, the second cut side surface 21 becomes an open surface.

Figure 14:
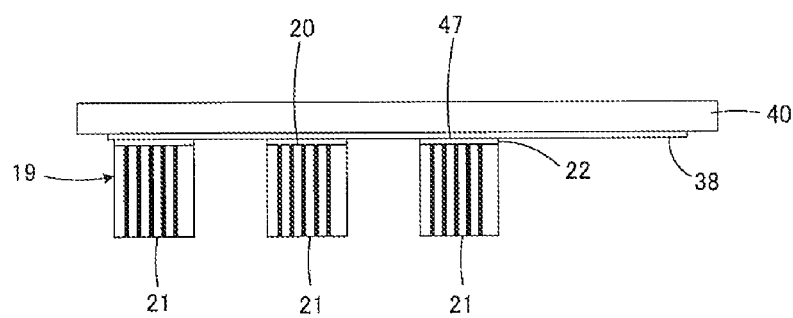
FIG. 14 is a view as seen from the direction of the end surface of the green chips, illustrating a state obtained after the tumbling step illustrated in FIGS. 13A and 13B, in which the green chips are held by a support base while sticking to an adhesive sheet via the first ceramic protective layer.

FIG. 14 illustrates a state obtained after the step described above with reference to FIGS. 13A and 13B. That is, FIG. 14 illustrates a state in which the green chips 19 are held by the support base 40 while sticking to the adhesive sheet 38 via the first ceramic protective layer 22, with the second cut side 21 of the green chips 19 facing downwards.

Figure 15:
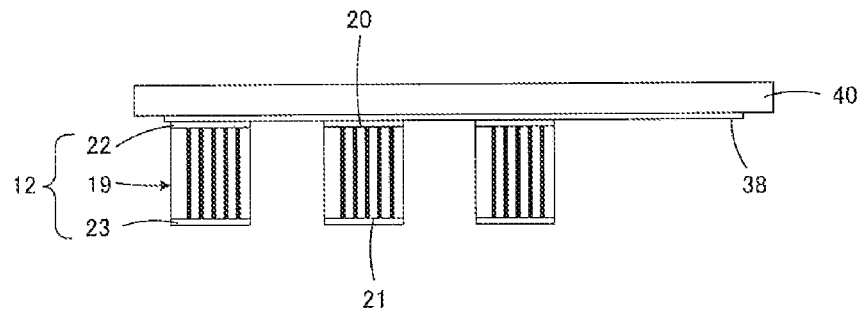
FIG. 15 is a view as seen from the direction of the end surface of raw component bodies that are obtained after performing an adhesive applying step, a side surface ceramic green sheet affixing step, and a compression bonding step again in the state illustrated in FIG. 14, the raw component bodies including raw first and second ceramic protective layers respectively formed on first and second cut side surfaces of the green chips.

In the state illustrated in FIG. 14, the adhesive applying step, the side surface ceramic green sheet affixing step, and the compression bonding step described above are performed for the second cut side surface 21 of the green chips 19. As a result, as illustrated in FIG. 15, a plurality of raw component bodies 12 are obtained which are in a state in which, with the green chips 19 being supported by the support base 40 via the adhesive sheet 38, the first and second ceramic protective layers 22 and 23 in their raw state are formed on the first and second cut side surfaces 20 and 21 of the green chips 19, respectively, as a result of the two affixing steps described above.

The compression bonding step may be performed only after forming the second ceramic protective layer 23, so that thermo-compression bonding is performed at the same time for both the first and second ceramic protective layers 22 and 23.

Figure 16:
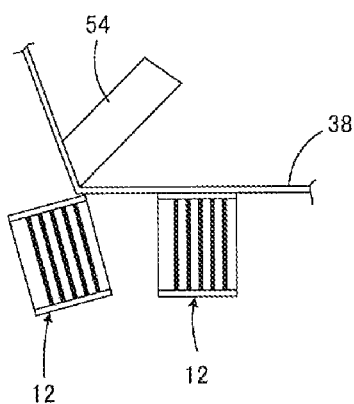
FIG. 16 is a view as seen from the direction of the end surface of the raw component bodies, illustrating a step of collecting each raw component body from the adhesive sheet illustrated in FIG. 15.

Next, after the raw component bodies 12 are detached from the support base 40 together with the adhesive sheet 38, as illustrated in FIG. 16, each of the raw component bodies 12 is collected by peeling the adhesive sheet 38 from the raw component body 12. In this step, a knife edge 54 is pressed against the adhesive sheet 38 from above while making the raw component body hang down from the adhesive sheet 38, thereby bending the adhesive sheet 38 so as to protrude downwards. As the adhesive sheet 38 is bent, the raw component body 12 comes off the adhesive sheet 38, drops downwards, and is collected.

Next, the raw component body 12 is fired. Although also depending on the ceramic material included in the stacking ceramic green sheets 31 and the ceramic protective layers 22 and 23 or the metallic material included in the internal electrodes 26 and 27, the firing temperature is selected within the range of about 900° C. to 1300° C., for example. If the thickness of the side surface ceramic green sheet 47 is, for example, about 25 µm to about 40 µm before firing, after firing, the thickness of the side surface ceramic green sheet 47 shrinks to about 20 µm to about 30 µm.

Next, by applying and firing a conductive paste onto the both end surfaces 17 and 18 of the component body 12 that has been fired, and further applying plating as required, the external electrodes 28 and 29 are formed. It is also possible to apply a conductive paste to the component body 12 in its raw state, and perform firing of the conductive paste simultaneously with firing of the raw component body 12.

In this way, the monolithic ceramic capacitor 11 illustrated in FIG. 1 is completed.

While the present invention has been described above in association with a specific preferred embodiment, other various modifications are possible within the scope of the present invention.

Figure 17:
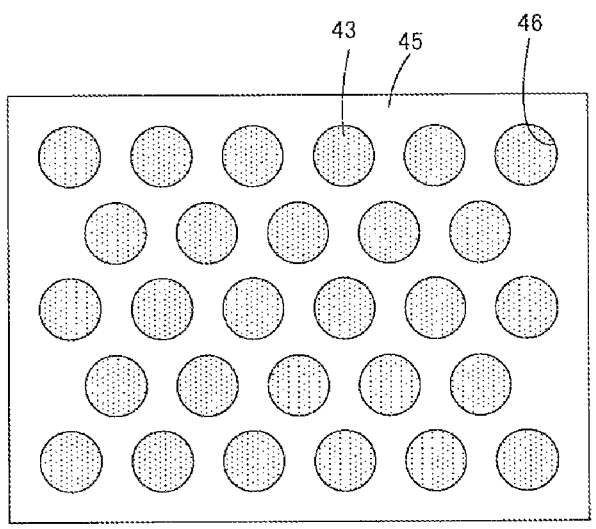
FIG. 17 is a plan view of an application plate according to a first modification, illustrating a second preferred embodiment of the present invention.
Figure 18:
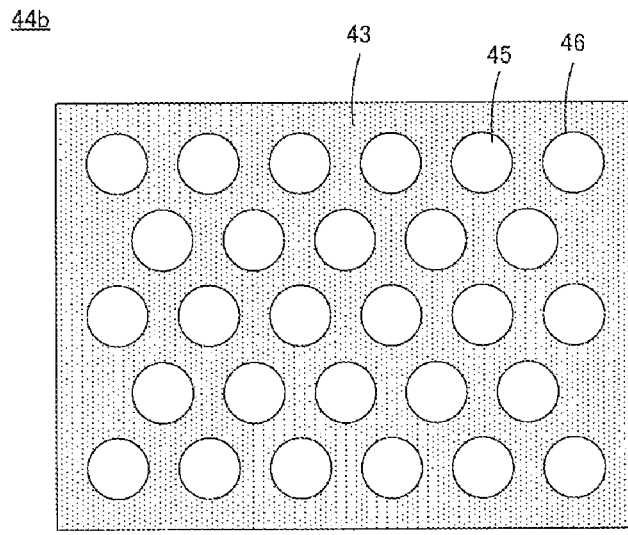
FIG. 18 is a plan view of an application plate according to a second modification, illustrating a third preferred embodiment of the present invention.

For example, the following modifications are also possible for the application plate 44 illustrated in FIGS. 8 and 9. FIGS. 17 and 18 illustrate first and second modifications of the application plate, respectively. In FIGS. 17 and 18, elements corresponding to the elements illustrated in FIGS. 8 and 9 are denoted by the same symbols, and a repetitive description is omitted.

An application plate 44a illustrated in FIG. 17 includes an application surface 45 that abuts against the cut side surface of the green chips. The application surface 45 is provided with a plurality of recesses 46 having, for example, a circular plane shape. The plurality of recesses 46 are distributed at substantially equal intervals across the application surface 45. The recesses 46 are filled with the adhesive 43.

An application plate 44b illustrated in FIG. 18 includes an application surface 45 that abuts against the cut side surface of the green chips. The application surface 45 is defined by the top surface of a plurality of protrusions having, for example, a circular plane shape. The protrusions are distributed in the plane direction of the application plate 44b. The portion other than the protrusions serves as a recess 46. The recess 46 is filled with the adhesive 43.

Figure 19:
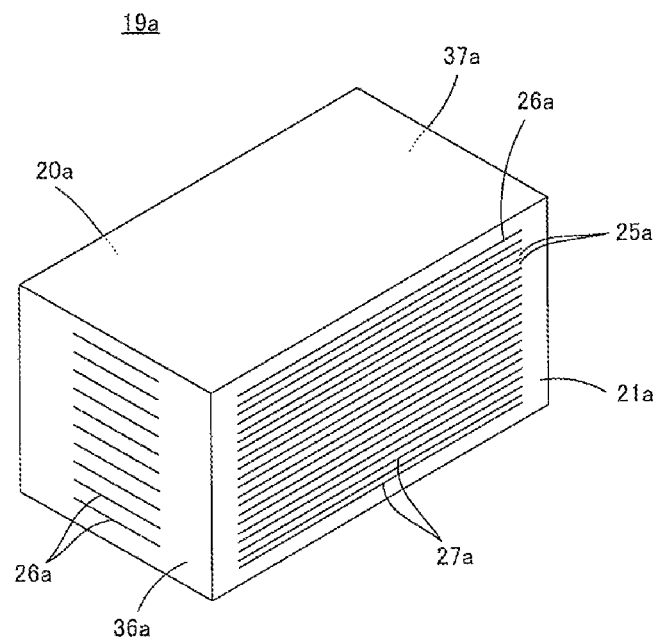
FIG. 19 is a perspective view of the outward appearance of a green chip, illustrating a fourth preferred embodiment of the present invention.
Figure 20A:
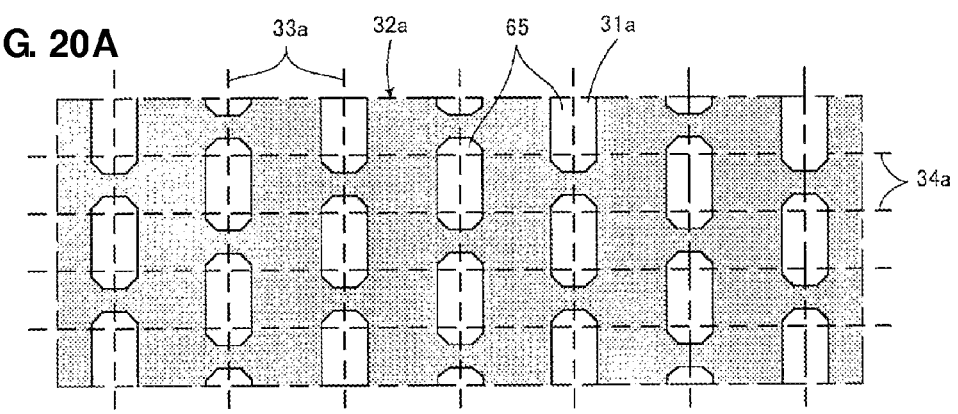
FIGS. 20A and 20B are plan views of ceramic green sheets which are prepared to obtain the green chip illustrated in FIG. 19 and on which an internal electrode pattern is formed.
Figure 20B:
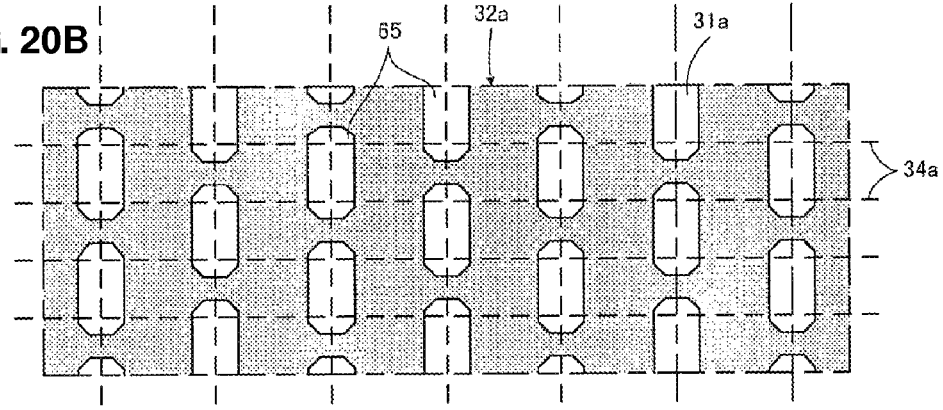
Figure 21A:
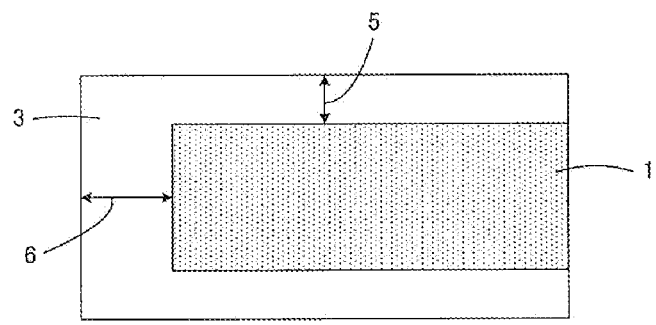
FIGS. 21A and 21B are respectively a plan view of a first ceramic green sheet on which a first internal electrode is formed, and a plan view of a second ceramic green sheet on which a second internal electrode is formed, illustrating a typical manufacturing method for a monolithic ceramic capacitor according to the related art.
Figure 21B:
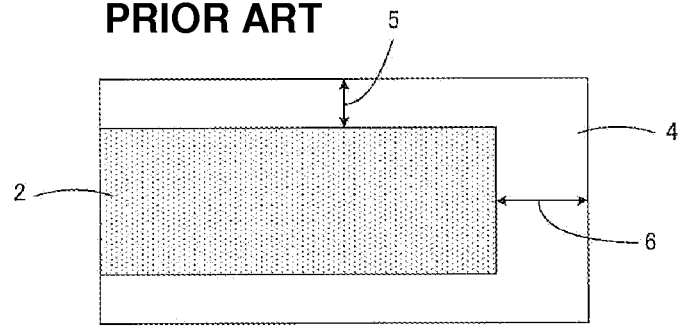

The internal electrodes and the internal electrode pattern can be also modified as follows, for example. FIG. 19 is a perspective view corresponding to FIG. 3, illustrating the outward appearance of a green chip 19a. FIGS. 20A and 20B are plan views corresponding to FIGS. 5A and 5B, illustrating stacking ceramic green sheets 31a on which an internal electrode pattern 32a is formed. The stacking ceramic green sheets 31a are prepared to obtain the green chip 19a illustrated in FIG. 19.

As illustrated in FIG. 19, the green chip 19a has a laminated structure including a plurality of ceramic layers 25a and a plurality of first and second internal electrodes 26a and 27a which are in a raw state. The first and second internal electrode 26a and 27a are arranged alternately in the stacking direction.

On the other hand, as illustrated in FIGS. 20A and 20B, the internal electrode pattern 32a formed on the stacking ceramic green sheets 31a preferably has a meshed configuration, and preferably has a form such that the portion to become an opposing section as the major portion of the internal electrodes 26a, and the portion to become an opposing section as the major portion of the internal electrodes 27a are arranged contiguously while being alternately connected in the vertical direction.

FIGS. 20A and 20B illustrate first cutting lines 34a along a first direction, that is, the horizontal direction, and second cutting lines 33a along a second direction perpendicular or substantially perpendicular to the first direction, that is, the vertical direction. In the green chip 19a mentioned above, cut side surfaces 20a and 21a are surfaces that are produced by cutting along the first cutting lines 34a, and end surfaces 36a and 37a are surfaces that are produced by cutting along the second cutting lines 33a. All of the internal electrodes 26a and 27a are exposed on the cut side surfaces 20a and 21a. Only the first internal electrodes 26a are exposed on the end surface 36a, and only the second internal electrodes 27a are exposed on the other end surface 37a.

In the meshed internal electrode pattern 32a illustrated in FIGS. 20A and 20B, perforations 65 where no internal electrode pattern is to be formed are arranged in a staggered manner. The perforations 65 preferably have an octagonal shape that is elongated in the vertical direction. The portion to become the lead section for each of the internal electrodes 26a and 27a is located between the perforations 65 that are adjacent to each other in the vertical direction.

In stacking the stacking ceramic green sheets 31a, as illustrated in FIGS. 20A and 20B, the stacking ceramic green sheets 31a are stacked with a shift so that their internal electrode patterns 32a are shifted from each other in the horizontal direction by a distance corresponding to the horizontal spacing of the perforations 65.

A mother block obtained by the above-mentioned stacking is cut along the cutting lines 33a and 34a illustrated in FIGS. 20A and 20B, and the green chip 19a as illustrated in FIG. 19 is obtained. Each of the second cutting lines 33a is located so as to divide the perforations 65 in halves in the horizontal direction, and the first cutting lines 34a are located in such a way that two cutting lines 34a cross a single perforation 65.

In the preferred embodiment described above with reference to FIG. 19 and FIGS. 20A and 20B, the lead section of each of the internal electrodes 26a and 27a is narrower in width than the opposing section of each of the internal electrodes 26a and 27a, and extends with a predetermined width. The area of the opposing section that is contiguous to the lead section gradually decreases in width so as to become substantially equal to the width of the lead section.

In the above-mentioned preferred embodiment, by modifying the shape of the perforations 65, the shape of the lead section of each of the internal electrodes 26a and 27a, and the shape of the end of the opposing section that is contiguous to the lead section can be modified in various ways. For example, it is also possible to modify the shape of the perforations 65 to be a rectangle.

In the aforementioned preferred embodiment, after the green chips 19 are obtained from the mother block 35 by cutting the mother block 35 along each of the cutting lines 33 and 34 illustrated in FIGS. 5A and 5B, the side surface ceramic green sheet 47 is applied to the cut side surfaces 20 and 21. This step can be also modified as follows.

That is, a first cutting step is performed first. In the first cutting step, after the mother block 35 is obtained, the mother block 35 is cut only along the first cutting lines 34 illustrated in FIGS. 5A and 5B to thereby obtain a plurality of rod-shaped green block bodies, with the internal electrodes 26 and 27 being exposed on the cut side surfaces 20 and 21 that are produced by cutting along the first cutting lines 34.

Next, an affixing step and a tumbling step that are substantially the same as the affixing step and the tumbling step previously mentioned with reference to FIGS. 7A to 15 are performed for the rod-shaped green block bodies. As a result, the side surface ceramic green sheet 47 is affixed to the cut side surfaces 20 and 21, and the ceramic protective layers 22 and 23 in their raw state are formed on the rod-shaped green block bodies.

Next, a second cutting step is performed. In the second cutting step, each of the rod-shaped green block bodies on which the raw ceramic protective layers 22 and 23 have been formed is cut along the second cutting lines 33 perpendicular or substantially perpendicular to the above-mentioned first direction, thereby obtaining a plurality of raw component bodies 12.

Thereafter, as in the aforementioned preferred embodiment, each of the raw component bodies 12 is fired, and the same steps as those mentioned above are subsequently performed, thereby completing the monolithic ceramic capacitor 11.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A manufacturing method for a monolithic ceramic electronic component, comprising the steps of:
    preparing a mother block including a plurality of ceramic green sheets that are stacked on each other, and an internal electrode pattern arranged along each of a plurality of interfaces between the ceramic green sheets; and
    cutting the mother block along a first cutting line and a second cutting line extending in mutually perpendicular or substantially perpendicular directions to obtain a plurality of green chips, the green chips each having a laminated structure including a plurality of ceramic layers and a plurality of internal electrodes that are in a raw state, the internal electrodes being exposed on a cut side surface that is produced by cutting along the first cutting line; wherein
    the green chips obtained by the cutting step are arrayed in row and column directions; and the manufacturing method further comprises the step of, after the cutting step, tumbling the green chips in a state in which the green chips arrayed in the row and column directions are spaced apart from each other, to make the cut side surface of each of the green chips uniformly an open surface; and further comprising the steps of:
- affixing a side surface ceramic green sheet to the cut side surface; and
- placing the side surface ceramic green sheet which is not backed with a carrier film on an affixation elastic body, which is deformed during the manufacturing method.

2. The manufacturing method for a monolithic ceramic electronic component according to claim 1, further comprising the step of:
- affixing the green chips arrayed in the row and column directions onto an adhesive sheet having expandability, and expanding the adhesive sheet on which the green chips have been affixed, so that the green chips arrayed in the row and column directions become spaced apart from each other in the tumbling step.

3. The manufacturing method for a monolithic ceramic electronic component according to claim 1, further comprising the steps of:
- pressing the cut side surface against the side surface ceramic green sheet with a force that substantially elastically deforms the affixation elastic body; and
- separating each of the green chips from the affixation elastic body in a state in which the side surface ceramic green sheet is stuck to the cut side surface.

4. The manufacturing method for a monolithic ceramic electronic component according to claim 3, wherein:
- the side surface ceramic green sheet has dimensions larger than the cut side surface; and
- the step of pressing the cut side surface against the side surface ceramic green sheet includes the step of punching the side surface ceramic green sheet by an edge of the cut side surface.

5. The manufacturing method for a monolithic ceramic electronic component according to claim 1, further comprising the step of thermo-compression bonding each of the green chips and a raw ceramic protective layer together at a temperature of not higher than about 200° C. to improve adhesion thereof, after forming the raw ceramic protective layer by affixing the side surface ceramic green sheet to the cut side surface.

6. The manufacturing method for a monolithic ceramic electronic component according to claim 1, further comprising the step of forming an external electrode on a predetermined surface of the monolithic ceramic electronic component so as to be electrically connected to a specific one of the internal electrodes.

* * * * *